United States Patent [19]

Carvella et al.

[11] Patent Number: 5,488,320

[45] Date of Patent: Jan. 30, 1996

[54] COMPARATOR HAVING LATCHED OUTPUT WHEN DISABLED FROM THE POWER SUPPLY

[75] Inventors: James S. Carvella; John H. Quigley, both of Phoenix, Ariz.

[73] Assignee: Motorola, Inc., Schaumburg, Ill.

[21] Appl. No.: 223,400

[22] Filed: Apr. 4, 1994

[51] Int. Cl.[6] .............................. H03K 3/289; H03K 5/22
[52] U.S. Cl. .................... 327/65; 327/203; 327/70
[58] Field of Search ................................ 327/63–70, 87, 327/89, 202, 203, 563, 564, 566, 199, 530

[56] References Cited

U.S. PATENT DOCUMENTS

| | | | |
|---|---|---|---|
| 4,970,406 | 11/1990 | Fitzpatrick et al. | 327/203 |
| 5,001,361 | 3/1991 | Tamamura et al. | 327/202 |
| 5,196,737 | 3/1993 | Olmstead | 327/63 |

Primary Examiner—Timothy P. Callahan
Assistant Examiner—Toan Tran
Attorney, Agent, or Firm—Robert D. Atkins

[57] ABSTRACT

A comparator (10) operates in comparator mode or in static leakage current test mode as determined by a control signal. In the comparator mode, the comparator receives a differential input signal for amplification through an analog differential front-end comparator input stage (31). The output of the comparator input stage is presented as a single-ended signal that is applied to an input of a buffer (32). The buffer amplifies the single-ended signal to digital logic levels. In test mode, the control signal enables a feedback circuit (36-42) from the output of the buffer back to its input and disables the differential front-end comparator input stage by removing the power supply. The last valid data state present at the output of the buffer is thus latched back to its input to allow static leakage current testing of down-stream circuitry without interference from the comparator drawing large static currents.

9 Claims, 2 Drawing Sheets

5,488,320

COMPARATOR HAVING LATCHED OUTPUT WHEN DISABLED FROM THE POWER SUPPLY

BACKGROUND OF THE INVENTION

The present invention relates in general to the testing of integrated circuits and, more particularly, to latching the output state of a comparator circuit to allow static leakage current testing in the gate array.

High-speed data transmission systems often use low-level signals across the transmission medium in order to achieve high data switching speeds. Low-level signals switch faster because there is less charging and discharging of nodal and cross capacitances. In digital data systems, the digital signals are often converted to low amplitude analog signals for transmission. The analog signal signals are converted back to digital signals at the receiving end of the transmission system typically with analog comparators.

The receiving end of the transmission system often utilizes large scale integrated semiconductor gate arrays, typically 100,000 gates and more, for the comparator function and other digital processing. The large scale gate arrays generally use sub-micron CMOS transistors to achieve high speeds and high packing densities. As such, the small feature size geometries equate to transistor gate oxides that are typically less than 100 angstroms in thickness. Since there are a large number of gates in the array, the thin gate oxide represents an opportunity for oxide defect failures. Static leakage current tests, where no switching occurs during the test, have been implemented at the circuit level to verify the oxide integrity.

In arrays that utilize solely digital logic, the task of testing is straightforward. A logic test vector is applied to the gate array to exercise each gate oxide and the logic gates are allowed to reach steady-state with the given test vector. The resultant static leakage current is then measured. Additional test vectors are used to completely test the gate array. The static leakage current should be in nanoamp range if the gate oxides are good. Leakage currents in the microamp range indicate a possible defective oxide.

Testing becomes more difficult when analog comparators are added to the front-end of the gate arrays for converting the low-level analog signals back to digital logic levels. Typical data transmission systems encompass 2-bit or 64-bit parallel input signals, thus requiring 32 or 64 analog comparators respectively. Since the comparators consume static currents in the milliamp range, it is difficult to measure nanoamp to microamp leakage currents of other logic gates in the array. The comparator static current swamps any measurement of the logic gates static leakage current. Attempts to remove power from the comparators in the prior art to eliminate their effect on the logic gate static leakage current testing have proven ineffective because of the unpredictability of the output states of the comparators when power is removed. Some logic gates are not tested because the associated comparator output state is undefined. Therefore, total quality compliance cannot be assured simply by removing power from the comparators.

Hence, a need exists to power-down the analog comparator front-end while maintaining its output logic state to provide reliable testing of static leakage currents of other logic gates.

DETAILED DESCRIPTION OF THE PREFERRED EMBODIMENT

Figure 1:
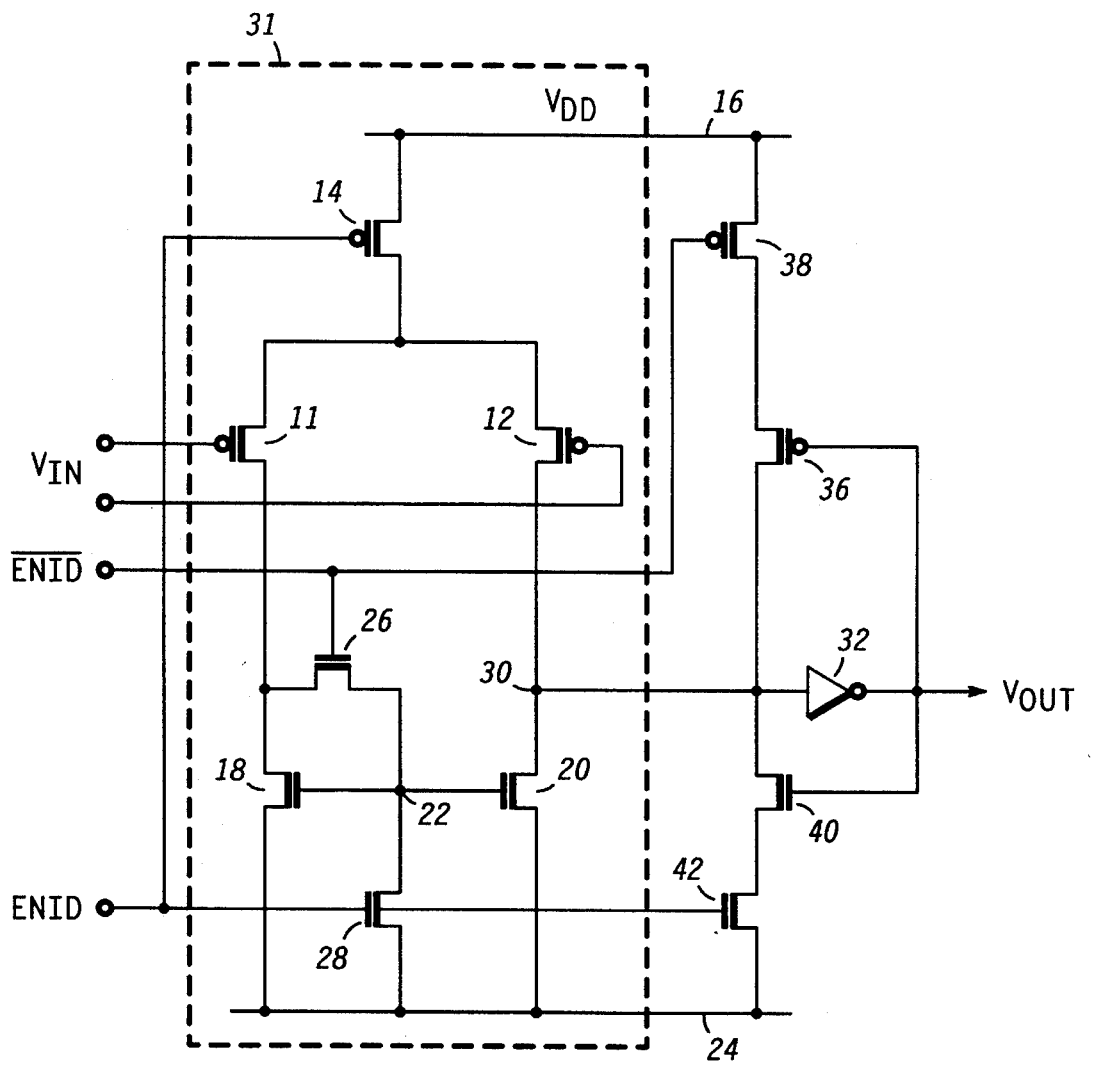
FIG. 1 is a schematic diagram illustrating an analog comparator with power-down while retaining the output logic state.

Referring to FIG. 1, a differential analog input signal $V_{IN}$ operating at say 400 millivolts is transmitted across a transmission line (not shown) to allow maximum data transmission rate. Low-level signals switch faster because there is less charging and discharging of nodal and cross capacitances. The low-level analog input signal $V_{IN}$ is applied across the inputs of differential comparator 10 for producing a digital output signal $V_{OUT}$ at the output of comparator 10. That is, comparator 10 converts the analog input signal received from the transmission medium back to digital logic levels for further processing.

The input signal $V_{IN}$ is applied to the gates of differentially coupled p-channel transistors 11 and 12. The sources of transistors 11 and 12 are coupled to the drain of p-channel transistor 14. The source of transistor 14 is coupled to power supply conductor 16 operating at a positive potential $V_{DD}$ such as 5.0 volts. Under normal operation, transistor 14 functions as a current source between power supply conductor 16 and the source-drain conduction paths of transistors 11 and 12, enabled by control signal ENID. During static leakage current testing, also known as IDDQ mode testing (IDD quiescent current drawn from power supply $V_{DD}$ when the circuit is not switching), transistor 14 turns off and decouples transistor pair 11-12 from power supply conductor 16 to remove power from the differential front-end input stage of comparator 10.

The drains of transistors 11 and 12 are coupled to the drains of n-channel transistors 18 and 20 respectively with the common drains of transistors 12 and 20 forming node 30. The gates of transistors 18 and 20 are coupled to the source of n-channel transistor 26 at node 22. The sources of transistors 18 and 20 are coupled to power supply conductor 24 operating at ground potential. Transistors 18 and 20 provide a load resistance for the differential current amplification and also provide differential to single-ended conversion in the differential front-end comparator input stage 31 that includes transistors 11-28. The single-ended signal appears at node 30. The drain of transistor 26 is coupled to the common drains of transistors 11 and 18 to form a switch that is activated by control signal $\overline{\text{ENID}}$ applied at the gate of transistor 26. Control signals ENID and $\overline{\text{ENID}}$ are complementary in nature. Transistor 26 enables a current mirror operation of transistors 18 and 20 to achieve the single-ended output signal at node 30. N-channel transistor 28 has its drain coupled to node 22 and its source coupled to power supply conductor 24 while its gate receives control signal ENID.

Single-ended output node 30 is coupled to the input of inverting buffer 32. Buffer 32 provides amplification of the single-end signal appearing at node 30 to achieve digital logic levels at its output for the output signal $V_{OUT}$. The digital output signal $V_{OUT}$ is coupled back to the gates of p-channel transistor 36 and n-channel transistor 40. The drains of transistors 36 and 40 are coupled to the input of buffer 32 at node 30. Under static current leakage test conditions when power is removed from front-end comparator input stage 31, the feedback arrangement between the output of buffer 32 through transistor 36 or 40 back to the input of buffer 32 maintains the last signal state at node 30. Transistor 38 has a source coupled to power supply conductor 16 and a drain coupled to the source of transistor 36. The gate of p-channel transistor 38 receives control signal $\overline{\text{ENID}}$. Transistor 42 has a drain coupled to the source of transistor 40 and a source coupled to power supply conductor 24. The gate of transistor 42 receives control signal ENID. During the static leakage current test mode, transistors 38 and 42 complete a current path from the power supply conductors to the input of buffer 32 such that the output signal $V_{OUT}$ may be latched through transistor 36 or 40 to the input to buffer 32.

As the evolution of VLSI and ULSI processing progresses towards higher transistor counts and reduction in transistor geometries, the principles of transistor scaling dictate that gate oxides must become thinner. The thinner oxides are much more susceptible to defects that may result in early life failures of critical system components. IDDQ static leakage current testing provides a method of measuring gate oxide integrity and assuring circuit reliability.

For an integrated circuit with transistors in the hundreds of thousands, IDDQ testing requires measuring of a total supply current that is on the order of magnitude of nanoamps. To stress the gates of an integrated circuit, the inputs to the circuit must be stimulated with enough different input signals, i.e. test vectors, to assure that sufficient stress has been applied to verify the overall oxide integrity. Reliable IDDQ measurements require that the system settles in a known static state which may take several microseconds. Since the settle time may be orders of magnitude longer than the clock period at which the circuit operates, it is important to perform IDDQ tests on the smallest sufficient set of the standard input vectors.

In addition, it is required that the IDDQ test does not introduce false states in the test. The absence of false states is only possible if all the data is retained when the circuit enters into the IDDQ mode. Comparators provide high speed data acquisition advantages and the ability to amplify small signals. The invention as presented provides the ability to retain valid data at the output of each comparator when the high current analog portion of the comparator is disabled, thus permitting the uninterrupted use of existing test vectors. A very efficient test system and a highly reliable product is produced as a result.

It is important to note that the embodiment of FIG. 1 does not disclose any actual IDDQ testing. A key feature of the present invention is to remove power from the front-end comparator input stage 31 of comparator 10 to eliminate its quiescent current draw while latching the last known output state of the comparator. The last known output state of comparator 10 now latched continues to drive further digital processing circuitry (not shown) where the IDDQ test is actually performed. The present invention is concerned with disabling the comparator and saving its latest output state so that down-stream circuitry undergoing IDDQ testing behave as if the comparator was still operating with negligible current drain.

The operation of differential comparator 10 proceeds as follows. When operating in comparator mode, control signal ENID is logic zero and $\overline{\text{ENID}}$ is logic one. Transistors 14 and 26 are conductive and transistors 28, 38 and 42 are disabled. Current source transistor 14 and current mirror load transistors 18, 20 and 26 enable the differential to single-ended amplification of input signal $V_{IN}$. When the analog voltage at the gate of transistor 11 is larger than that appearing at the gate of transistor 12, transistor 12 conducts substantially more current than transistor 11. A current path is established through transistors 14 and 12 causing node 30 to go to logic one. The signal appearing at node 30 is inverted and amplified by buffer 32 and appears as a logic zero output signal $V_{OUT}$. Since transistors 38 and 42 are disabled, transistors 36 and 40 have no conduction path and are non-conducting.

Similarly, when the analog voltage appearing at the gate of transistor 11 is less than that appearing at the gate of transistor 12, a conduction path is established through transistors 14, 11, 18, and 26 mirroring a current in transistor 20. Since transistor 12 conducts substantially less current than transistor 11, the voltage at node 30 goes to logic zero. A logic one voltage level for output signal $V_{OUT}$ appears at the output of buffer 32.

During the IDDQ test mode, control signal ENID goes to logic one and control signal $\overline{\text{ENID}}$ goes to logic zero. Transistor 14 becomes non-conductive thereby removing the supply current to the differential transistors 11 and 12. Transistor 26 is non-conductive. Transistor 28 turns on to disable current mirror transistors 18 and 20 by pulling node 22 to ground potential at power supply conductor 24. The differential front-end comparator input stage 31 of comparator 10 is effectively decoupled from all power supply conducting paths.

During the IDDQ test mode, transistors 38 and 42 are enabled by control signals ENID and $\overline{\text{ENID}}$ appearing at their gates respectively. The delay path in activating transistors 38 and 42 via control signals ENID and $\overline{\text{ENID}}$ respectively is faster than the delay path in the deactivation of the differential front-end comparator input stage 31. Consequently, the last valid data signal appearing at node 30 is inverted and amplified by buffer 32 and fed back through transistor 36 or 40 to node 30. As the differential front-end comparator input stage 31 decouples from power supply conductors 16 and 24 and transistors 12 and 20 reach a non-conductive state, node 30 retains the valid data state of the now latched buffer 32. The last valid data state is preserved and IDDQ testing can now proceed.

As an example during the IDDQ test mode, if the last known state at node 30 is low, the output signal $V_{OUT}$ is logic one. Transistor 40 conducts through the source-drain conduction path of activated transistor 42 holding the input of buffer 32 logic zero. The logic zero level is from the voltage of power supply conductor 24 plus the sum of the drain-source voltages of transistors 40 and 42. A logic one state is latched at the output of buffer 32. Transistor 36 is non-conductive due to the logic one at its gate. Likewise, if the last known state at node 30 is high, the output signal $V_{OUT}$ is logic zero. Transistor 40 is non-conductive while transistor 36 conducts through the source-drain conduction path of transistor 38 holding node 30 at logic one. The logic one level is from the voltage of power supply conductor 16 minus the sum of the drain-source voltages of transistors 36 and 38. A logic zero state is latched as the output signal $V_{OUT}$.

Figure 2:
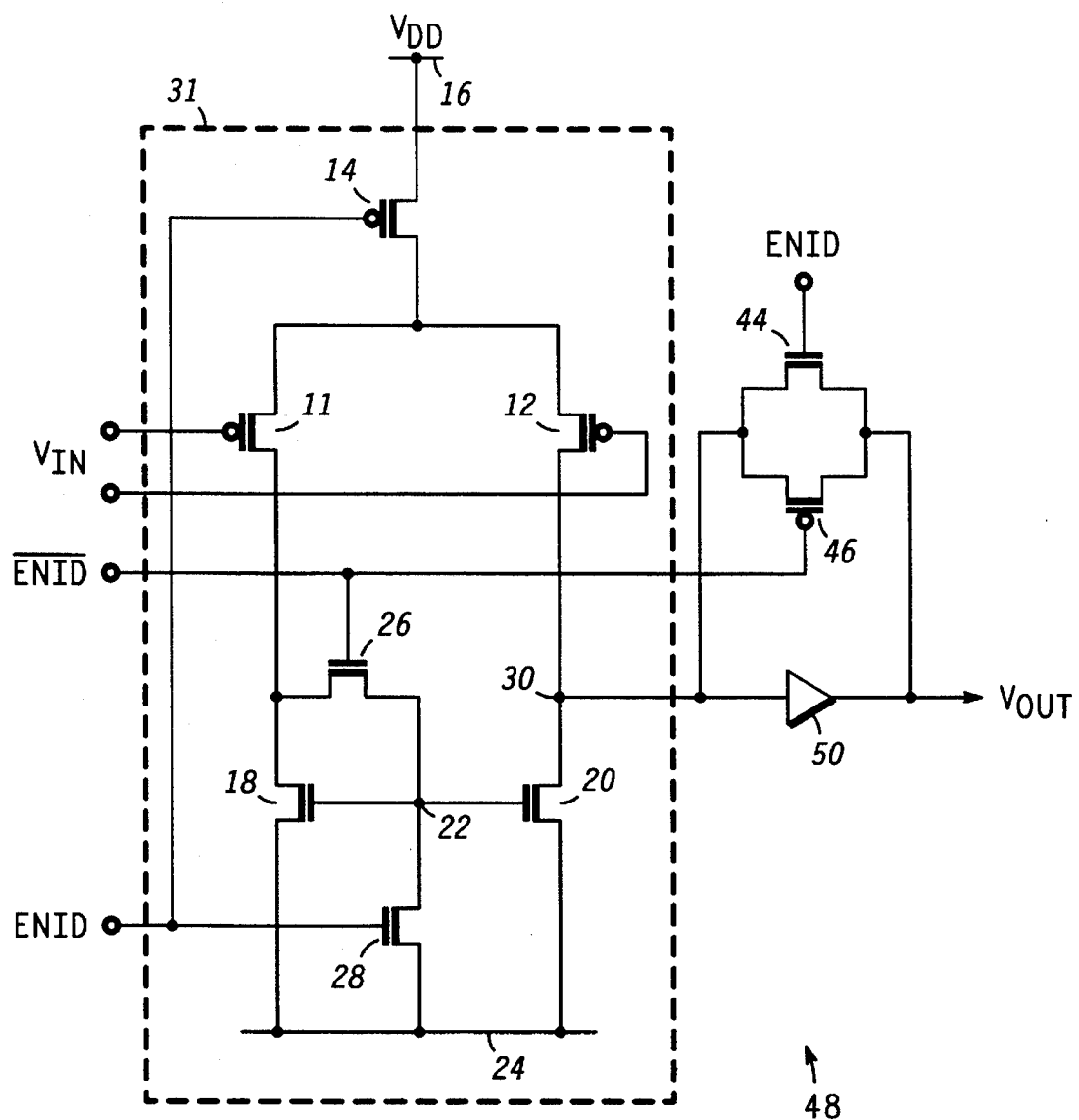
FIG. 2 is a schematic diagram illustrating an alternate embodiment of the analog comparator with power-down while retaining the output logic state.

Turning to FIG. 2, an alternate embodiment of the present invention is shown. Comparator 48 contains a similar differential front-end comparator input stage 31 as described for comparator 10. In comparator 48, transistors 36, 38, 40, and 42 are replaced with n-channel transistor 44 and p-channel transistor 46 configured as a transmission gate. Buffer 50 amplifies the voltage level at node 30 to digital logic levels but does not invert the signal. The gate of transistor 44 receives control signal ENID while the gate of transistor 46 receives control signal $\overline{\text{ENID}}$. The source of transistor 44 is coupled to the drain of transistor 46 at node 30. The drain of transistor 44 is coupled to the source of transistor 46 at the output of buffer 50.

During operation in the IDDQ test mode, the differential front-end comparator input stage 31 of comparator 48 is disabled as previously described for comparator 10 of FIG. 1. Upon application of a logic one ENID control signal and a logic zero $\overline{\text{ENID}}$ control signal, transistors 44 and 46 activate as a transmission gate to provide a positive feedback path from the output of buffer 50 to node 30. The positive feedback allows node 30 to be kept at a potential so as to preserve the last data state at node 30 as long as the differential front-end comparator input stage 31 is disabled. A low signal at node 30 appears as a logic zero at the output of non-inverting buffer 50. The logic zero is fed back to node 30 via the transmission gate arrangement of transistors 44 and 46 to latch the last valid data signal that appeared at node 30. In a similar fashion, a high signal at node 30 produces a logic one at the output of buffer 50. The logic one is fed back through transistors 44 and 46 to latch a logic one at node 30 to maintain the prior state of the output signal $V_{OUT}$ when front-end comparator input stage 31 is powered down.

It should be noted that the above described invention is equally suited for adaptation to mixed signal circuit testing where efficiency of testing is enhanced by preserving the last known state of applied test vectors. Also, the invention is adaptable as well for low power applications of mixed signal circuitry where it is desired to power-down analog circuitry while maintaining a known system state.

By now it should be appreciated that the present invention decouples a differential comparator from the power supply while retaining its output signal state. The current source and differential load current mirror circuit to the comparator differential input transistor pair are disabled by a control signal. The single-ended output of the comparator is first buffered and fed back from the output of the buffer to its input in response to the control signal to provide data retention of the comparator output state when the front-end comparator input stage is powered down. With the last valid state of the comparator latched and the comparator powered down, the IDDQ static leakage current testing may commence.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A comparator circuit, comprising:
   an input stage coupled for receiving a differential input signal and providing a single-ended output signal at a first node;
   first means for enabling and disabling a power supply to said input stage in response to a control signal;
   an inverting buffer having an input coupled to said first node and having an output for providing an output signal of the comparator circuit; and
   second means coupled between said output of said buffer in said first node for feeding back said output signal of the comparator circuit to said first node to latch said output signal of the comparator, said second means including,
   (a) a first transistor having a gate, a drain and a source, said gate being coupled for receiving an inverted control signal, said source being coupled to a first power supply conductor, and
   (b) a second transistor having a gate, a drain and a source, said source being coupled to said drain of said first transistor, said gate being coupled to said output of said inverting buffer, said drain being coupled to said first node.

2. The comparator circuit of claim 1 wherein said second means further includes:
   a third transistor having a gate, a drain and a source, said drain being coupled to said first node, said gate being coupled to said output of said inverting buffer; and
   a fourth transistor having a gate, a drain and a source, said gate being coupled for receiving said control signal, said drain being coupled to said source of said third transistor, said source being coupled to a second power supply conductor.

3. The comparator circuit of claim 2 wherein said input stage includes:
   fifth and sixth transistors each having a gate, a drain and a source, said gates receiving said differential input signal, said sources being coupled to said first power supply conductor for receiving said power supply;
   a seventh transistor having a gate, a drain and a source, said drain being coupled to said drain of said fifth transistors to provide a coupling therebetween, said source being coupled to said second power supply conductor; and
   an eighth transistor having a gate, a drain and a source, said drain being coupled to said drain of said sixth transistor at said first node, said source being coupled to said second power supply conductor, said gate being coupled to said gate of said seventh transistor at a second node, said second node being further coupled to said drain of said seventh transistor.

4. The comparator circuit of claim 3 wherein said first means includes a ninth transistor having a gate, a drain and a source, said gate being coupled for receiving said control signal, said source being coupled to said first power supply conductor, said drain being coupled to said sources of said fifth and sixth transistors.

5. The comparator circuit of claim 4 wherein said input stage further includes:
   a tenth transistor having a gate, a drain and a source, said gate being coupled for receiving said inverted control signal, said drain being coupled to said drain of said fifth transistor, said source being coupled to said second node to provide said coupling between said drain of said fifth transistor and said drain of said seventh transistor; and
   an eleventh tenth transistor having a gate, a drain and a source, said gate being coupled for receiving said control signal, said drain being coupled to said second node, said source being coupled to said second power supply conductor.

6. A comparator circuit, comprising:
   a differential input stage coupled for receiving a differential input signal and providing an output signal at a first node:
   first means for enabling and disabling a power supply to said differential input stage in response to a control signal:
   a buffer having an input coupled to said first node and having an output for providing an output signal of the comparator circuit; and second means coupled between said output of said buffer and said first node for feeding back said output signal of the comparator circuit to said first node to latch said output signal of the comparator, said second means including,
(a) a first transistor having a gate, a drain and a source, said gate being coupled for receiving said control signal, said drain being coupled to said output of said buffer, said source being coupled to said first node, and
(b) a second transistor having a gate, a drain and a source, said gate being coupled for receiving an inverted control signal, said source being coupled to said output of said buffer, said drain being coupled to said first node.

7. The comparator circuit of claim 6 wherein said differential input stage includes:

third and fourth transistors each having a gate, a drain and a source, said gates receiving said differential input signal, said sources being coupled to a first power supply conductor for receiving said power supply;

a fifth transistor having a gate, a drain and a source, said drain being coupled to said drain of said third transistor to provide a coupling therebetween, said source being coupled to a second power supply conductor; and a sixth transistor having a gate, a drain and a source, said drain being coupled to said drain of said fourth transistor, said source being coupled to said second power supply conductor, said gate being coupled to said gate of said fifth transistor at said first node, said gates of said fifth and sixth transistors being further coupled to said drain of said fifth transistor.

8. The comparator circuit of claim 7 wherein said differential input stage further includes:

a seventh transistor having a gate, a drain and a source, said gate being coupled for receiving said inverted control signal, said drain being coupled to said drain of said third transistor, said source being coupled to said second node to provide said coupling between said drain of said third transistor and said drain of said fifth transistor; and an eighth transistor having a gate, a drain and a source, said gate being coupled for receiving said control signal, said drain being coupled to said second node, said source being coupled to said second power supply conductor.

9. The comparator circuit of claim 8 wherein said first means includes a ninth transistor having a gate, a drain and a source, said gate being coupled for receiving said control signal, said source being coupled to said first power supply conductor, said drain being coupled to said sources of said third and fourth transistors.

* * * * *

UNITED STATES PATENT AND TRADEMARK OFFICE
CERTIFICATE OF CORRECTION

PATENT NO. : 5,488,320
DATED : January 30, 1996
INVENTOR(S) : James S. Caravella and John H. Quigley It is certified that error appears in the above-indentified patent and that said Letters Patent is hereby corrected as shown below:

In Claim 1, column 5, line 61, delete "in" and insert --and-- therefor.

In Claim 5, column 6, line 51, delete "tenth".

Signed and Sealed this

Ninth Day of September, 1997

Attest:

BRUCE LEHMAN

Attesting Officer

Commissioner of Patents and Trademarks